United States Patent
Chien et al.

[19]

[11] Patent Number: 6,130,149
[45] Date of Patent: Oct. 10, 2000

[54] APPROACH FOR ALUMINUM BUMP PROCESS

[75] Inventors: Wen-Chen Chien, Kaoshiung; Chi-Hsin Lo, Pin Chen; Ding-Jeng Yu, Taipei, all of Taiwan

[73] Assignee: Taiwan Semiconductor Manufacturing Company, Hsin-Chu, Taiwan

[21] Appl. No.: 09/374,298

[22] Filed: Aug. 16, 1999

[51] Int. Cl.[7] .............................. C23C 3/02; H01L 21/283
[52] U.S. Cl. .................... 438/613; 438/614; 438/629; 438/787; 438/970
[58] Field of Search ..................... 438/613, 614, 438/624, 634, 699, 763, 787, 631, 970, 626, 629, 63; 257/737, 768, 752, 758; 148/DIG. 51, DIG. 81, DIG. 131

[56] References Cited

U.S. PATENT DOCUMENTS

| | | | |
|---|---|---|---|
| 4,122,215 | 10/1978 | Vratny | 438/614 |
| 4,182,781 | 1/1980 | Hooper et al. | 438/614 |
| 4,879,257 | 11/1989 | Patrick | 438/624 |
| 5,057,453 | 10/1991 | Endo et al. | 437/183 |
| 5,366,911 | 11/1994 | Lur et al. | 438/631 |
| 5,403,780 | 4/1995 | Jain et al. | 438/624 |
| 5,445,994 | 8/1995 | Gilton | 437/183 |
| 5,516,729 | 5/1996 | Dawson et al. | 438/623 |
| 5,593,927 | 1/1997 | Farnworth et al. | 437/209 |
| 5,821,582 | 10/1998 | Duam | 257/327 |
| 5,858,870 | 1/1999 | Zheng et al. | 438/622 |
| 5,886,410 | 3/1999 | Chiang et al. | 438/623 |

*Primary Examiner*—Matthew Smith
*Assistant Examiner*—Igwe U. Anya
*Attorney, Agent, or Firm*—George O. Saile; Stephen B. Ackerman

[57] ABSTRACT

A method is disclosed for forming an aluminum bump on an integrated circuit (IC) chip without leaving any metal residue on the passivation layer of the chip. This is accomplished by planarizing the passivation layer with spin-on-glass (SOG) and then forming a PECVD oxide as a sacrificial layer over the SOG, and etching through these layers to form an opening over a metal pad underlying the passivation layer. Then, a layer of aluminum is deposited over the substrate, including the opening, to form an aluminum bump. Aluminum bump is next formed by etching through a patterned oxide which acts as a hard mask over the aluminum layer. The SOG is then removed leaving the passivation layer free of any aluminum residue.

23 Claims, 5 Drawing Sheets

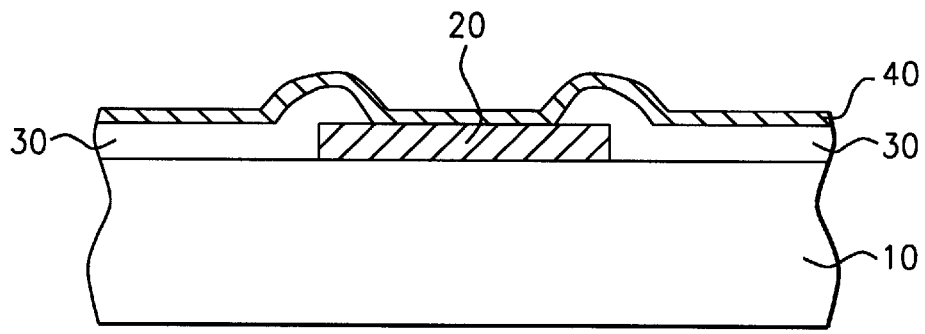
FIG. 1a - Prior Art
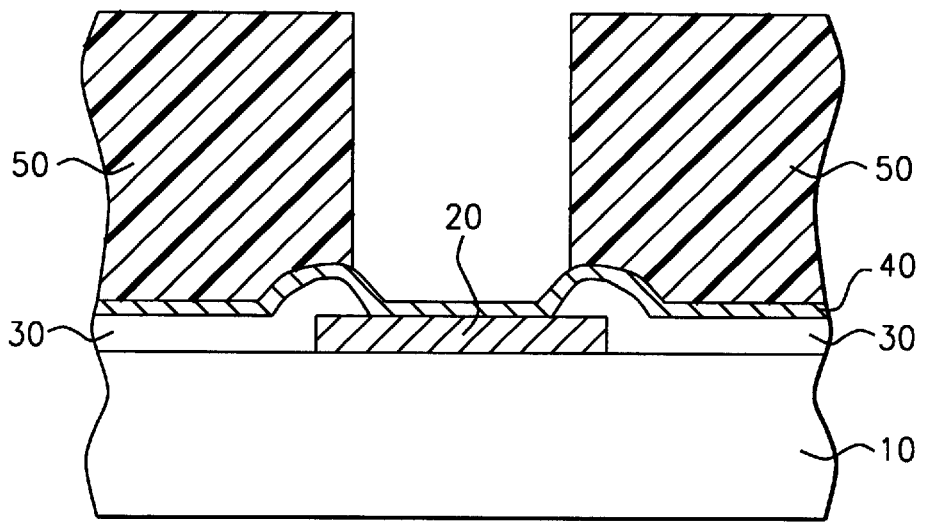
FIG. 1b - Prior Art
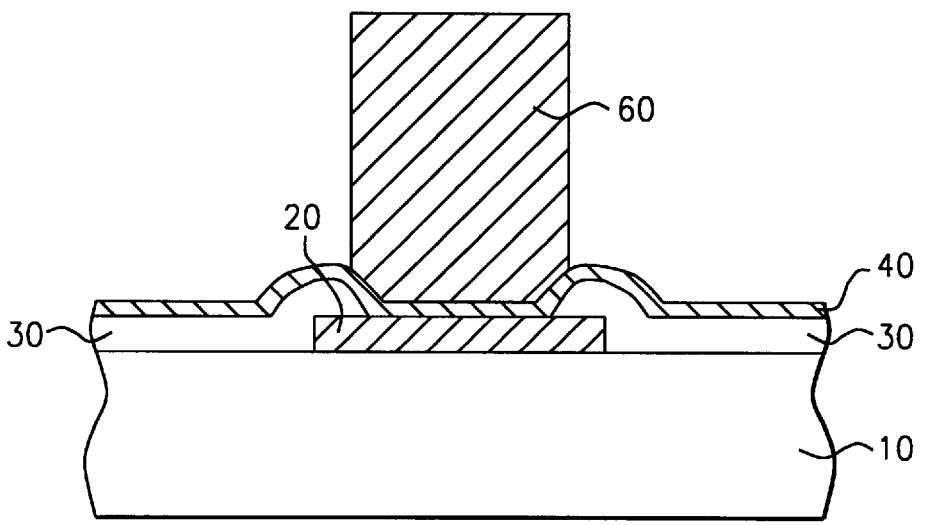
FIG. 1c - Prior Art

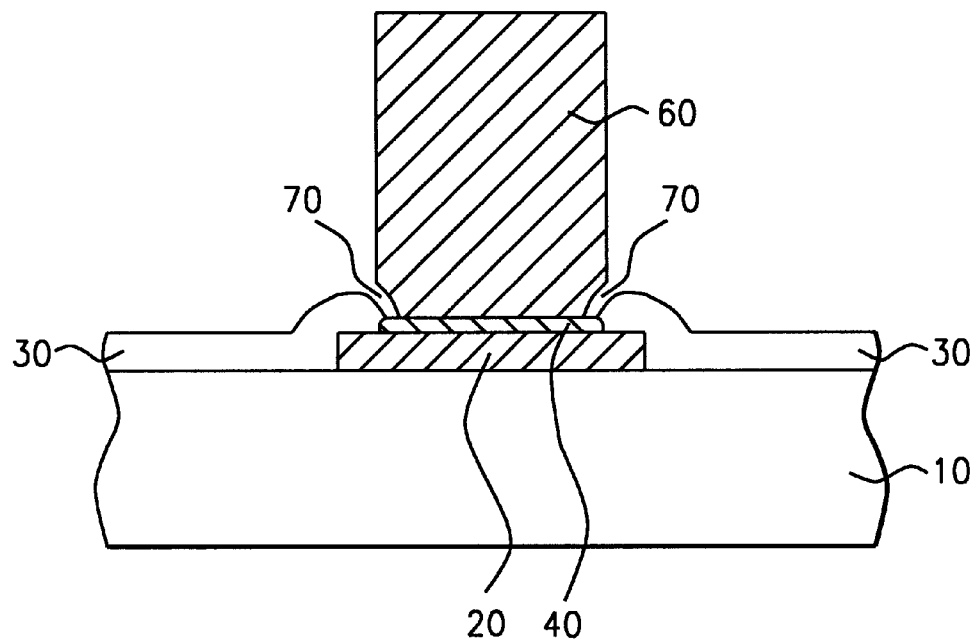
FIG. 1d – Prior Art
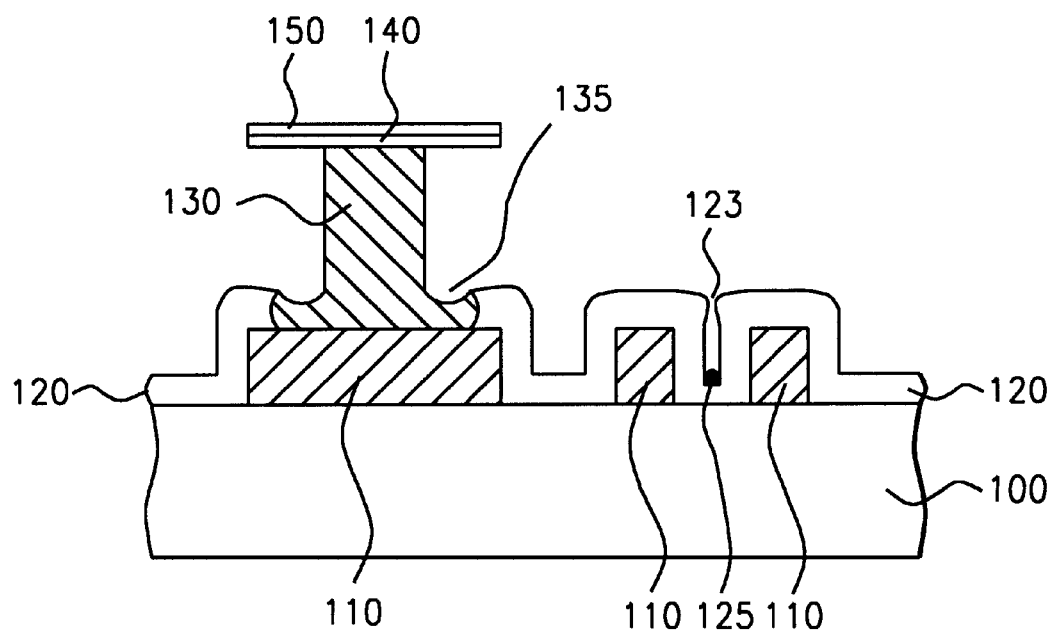
FIG. 2

APPROACH FOR ALUMINUM BUMP PROCESS

BACKGROUND OF THE INVENTION (1) Field of the Invention

The present invention relates to the manufacture of integrated circuit (IC) chips, and in particular to the forming of aluminum bumps in the packaging of IC chips.

(2) Description of the Related Art

Integrated circuits are formed on a silicon wafer which is then diced or cut to form individual die, also called chips, as is well known in the art. The circuits which are interconnected in each chip terminate at terminals on the chip. The appropriate chips are then interconnected with each other by bonding those terminals onto a card having its own interconnections. Depending upon the complexity and function of the final machine that is to be built, this first level package may in turn be interconnected with other first level cards by connecting the cards onto a second level package, usually called a board.

The chip level interconnection forming the first level package is usually performed using wirebonding (WB), tape automated bonding (TAB), or flip-chip solder connection, sometimes referred to as controlled collapse chip connection (C4). A detailed description of each of these interconnection schemes will not be given here so as to not obscure the key aspects of the present invention, and also, as they are not necessary to the understanding of the teachings of the present invention. Suffice it to say, however, that in each one of these schemes, a terminal, in the form of a cubical bump—as it will be described more fully later—is required to form the chip to chip interconnection at the first level of packaging.

A conventional bump structure of a semiconductor device and a method forming of the same is shown in FIGS. 1a–1d following Endo, et al., in U.S. Pat. No. 5,057,453. In prior art FIG. 1a, semiconductor substrate (10) is shown having an aluminum electrode pad (20). An insulating passivation film, layer (30) in the same FIG. 1a, is formed over the substrate and a partial opening is next formed in the insulation layer over the Al pad. A metal film, as barrier metal layer (40), is then deposited over passivation layer (30), including over pad (20) by using any number of conventional methods such as vapor deposition or sputtering.

Next, a photopolymerized high polymer dry film (50) is pressure-laminated on metal film (40). The dry film is patterned to form an opening with a size corresponding to a desired bump side length, at the position only above electrode pad (20). Then, using the patterned dry film as a plating mask, and metal film (40) as one of the electrodes, gold, Au, is selectively electroplated only within the opening of the dry film (50).

Next, the dry film is removed, and a cubical Au deposit (60) is obtained on metal film (40) above electrode pad (20), as shown in FIG. 1c. Subsequently, using the gold metal as a mask, metal film (40) is etched as shown in FIG. 1d. Thus, a semiconductor device with a gold bump (60) of a conventional structure is formed on metal film (40) above Al electrode pad (20).

It will be noted in FIG. 1d, however, that when etching of metal film (40) is performed, there is usually an incursion of the etchants under gold bump (60) such that cavity (70), or an undercut, is formed. This can be detrimental in many ways. First, peel strength of the bump is degraded as the cross-sectional area of the interfacial area between the bump and the metal film is decreased. Secondly, cavity (70) can harbor contaminants which corrode the aluminum electrode. Endo discloses a method of forming a skirt extending outward from the bottom of the cubical bump to prevent the formation of cavity (70).

Gilton in U.S. Pat. No. 5,445,994 proposes a different method for forming custom planar metal bonding pad connectors. The method includes the steps of depositing a passivation layer on the bonding pads; forming a patterning layer by depositing a dielectric materials on the passivation layer; etching through the patterning layer and passivation layer to the bond pads using a first etch mask; etching a connector pattern in the patterning layer using a second etch mask; depositing a metal layer over the patterning layer; and then planarizing the metal layer to an endpoint of the pattering layer to form planar metal connectors.

Farnwoth, et al., provide a method for packaging semiconductor dice. In U.S. Pat. No. 5,593,927, the inventors use an additional protective layer and conductive traces on the die where the protective layer is formed with a tapered peripheral edge to facilitate insertion of die into a die holder.

It is disclosed later in the embodiments of the present invention a different method of forming bonding pads in the form of aluminum bumps which is especially suited for tape-automated-bonding of integrated circuit, IC chips in advanced packaging technology.

SUMMARY OF THE INVENTION

It is therefore an object of this invention to provide a method of forming an aluminum bump on an integrated circuit (IC) chip.

It is another object of the present invention to provide a method of forming an aluminum bump on an IC chip without leaving any aluminum residue on the passivation layer of the chip.

It is still another object of the present invention to provide a method of improving the aluminum bump process for tab-automated bonding (TAB) of IC chips.

BRIEF DESCRIPTION OF THE DRAWINGS

FIG. 1a is a cross-sectional view of a portion of a semiconductor substrate showing the metallization process of prior art.

FIG. 1b is a cross-sectional view of a portion of a semiconductor substrate showing the patterning of a photoresist layer to define the bump of prior art.

FIG. 1c is a cross-sectional view of a portion of a semiconductor substrate showing the forming of a bump of prior art.

FIG. 1d is a cross-sectional view of a portion of a semiconductor substrate showing the forming of an undercut under the bump of prior art.

FIG. 2 is a cross-sectional view of a portion of a semiconductor substrate showing a metal residue formed in an inclusion of the passivation layer during the bump process as currently practiced in the present manufacturing line.

DESCRIPTION OF THE PREFERRED EMBODIMENTS

Figure 3A:
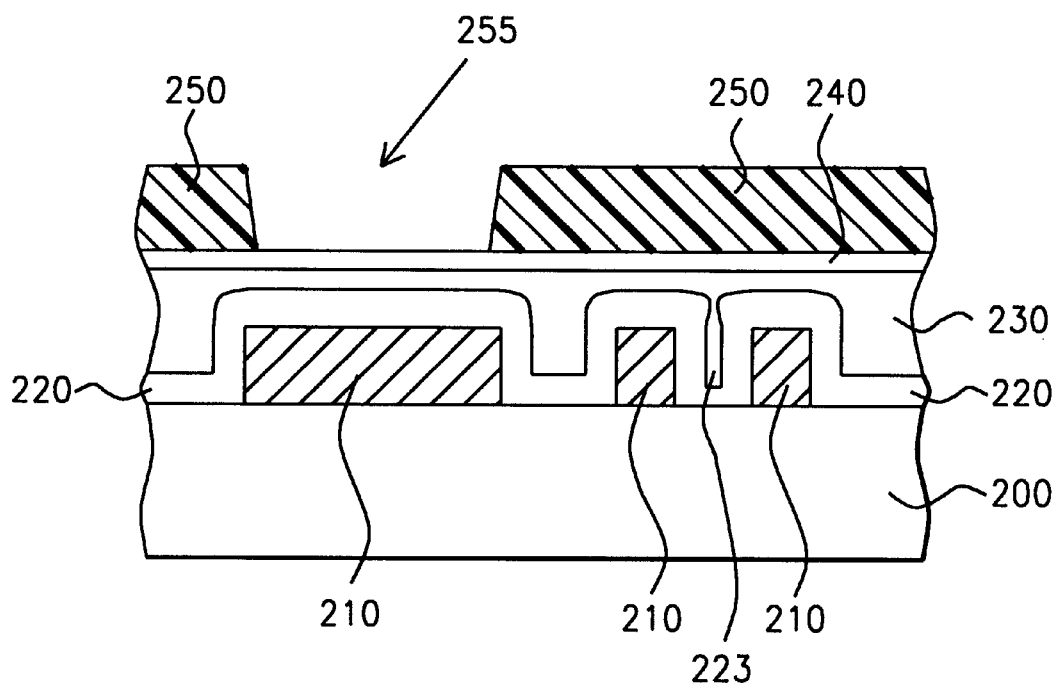
FIG. 3a is a cross-sectional view of a portion of a semiconductor substrate showing the forming of a sacrificial dielectric layer over the passivation layer, according to the present invention.

Referring now to the drawings, that is, to FIG. 2, and in particular to FIGS. 3a–3f, there are shown steps of forming an aluminum bump on an integrated circuit (IC) chip.

A current method of forming a cubical aluminum bump in the present manufacturing line is shown in FIG. 2 where substrate (100) is provided with top metal layer (110) interconnected to underlying multi-level metal layers through intervening insulating dielectric layers, and ultimately to integrated circuit devices that have already been conventionally formed within and on the substrate. These conventional steps are well known in the art and as they are not significant to the invention, they are not described in detail here in order not to unnecessarily obscure the present invention.

Upon layer (110), passivation layer (120) is formed, and an opening is etched over that portion of the layer, called a pad, where an outside connection is to be made. An aluminum layer is then deposited over passivation layer (120) followed by the patterning of oxide layers (140) and (150) which are used as a mask to etch the aluminum layer to form aluminum bump (130) as shown in FIG. 2. It will be apparent to those skilled in the art that during the etching of the aluminum layer, not all aluminum is removed from the passivation layer as the passivation layer forms various narrow inclusions such as depicted by cavity (123) shown in FIG. 2., and it is difficult to remove aluminum residue (125) from such inclusions which can be as deep as 1.5 micrometers ($\mu$m). The present invention discloses a method of preventing the entry of metal into such inclusions by providing a sacrificial spin-on-glass (SOG) layer that is formed prior to depositing aluminum layer over the passivation layer.

In the preferred embodiment shown in FIGS. 3a–3f, substrate (200) is provided with metal layer (210) similar to layer (120) conventionally formed in FIG. 2. As is well known in the art, aluminum is generally used as the top level metal in multilevel-metal IC chips because wire-bonding technology as well as tape-automated-bonding (TAP) to Al thin films is a well-characterized process. Metal layer (210) can be copper also. A composite passivation dielectric layer (220) is next formed over the metal layer. Forming dielectric layers are known in the art. Blanket dielectric layers may be formed from materials including but not limited to silicon oxide materials, silicon nitride materials, and silicon oxynitride materials formed within integrated circuits through methods including but not limited to chemical vapor deposition CVD, plasma enhanced CVD (PECVD), or, physical vapor deposition (PVD) sputtering methods. For the preferred embodiment of the present invention, the passivation layer comprises two layers. Preferably, the first dielectric layer is PEOX (plasma enhanced oxide) formed to a thickness between about 4000 to 5000 Å, and the second layer is PESN (plasma enhanced silicon nitride) formed to a thickness between about 6000 to 6500 Å. It is preferred that the nitride is formed by reacting dichlorosilane ($SiCl_2H_2$), or silane ($SiH_4$), with ammonia ($NH_3$) at a temperature between about 650 to 750° C.

It will be noted that passivation layer (220) follows the topography of the underlying metal layer (210) so that inclusions such as (223) are inevitably formed. As described earlier, conventional methods of depositing the next level of metal directly over the passivation layer would cause metal to reside in inclusions, thereby giving rise to metal residues in the passivation layer. A main feature and key aspect of the present invention is to prevent such residues forming in inclusions (223). For this purpose, a composite dielectric layer is formed. First, a layer of SOG, layer (230) in FIG. 3a, is formed over the surface of passivation layer (220), including inclusion (223). It is preferred that the SOG thickness is between about 2500 to 3500 Å. Thus, inclusion (223) is sealed against entry of any contaminant residues that may be encountered during the subsequent process steps.

Figure 3B:
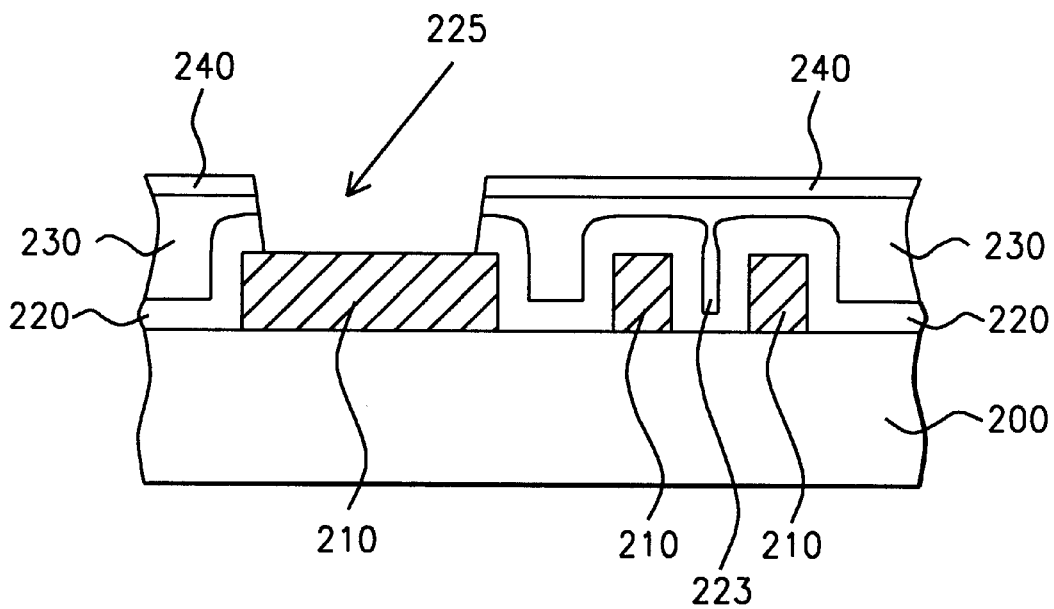
FIG. 3b is a cross-sectional view of a portion of a semiconductor substrate showing the forming of an opening over a metal pad according to the present invention.

Next, SOG layer (230) is planarized by using conventional techniques to form a smooth surface, upon which a layer of PEOX—layer (240) in FIG. 3a—is formed to a thickness between about 900 to 1100 Å. This is followed by the forming of photoresist layer (250), which in turn is patterned with opening (255) over metal pad area (210) as shown in FIG. 3a. Layers (240), (230), and passivation layer (220) are then etched through patterned opening (255) in photoresist layer (250) to form opening (225) to expose metal pad (210), as shown in FIG. 3b. It is preferred that etching is accomplished with a recipe comprising He, $CHF_3$ and $CF_4$. After the etching, photoresist layer is removed using oxygen plasma ashing.

Figure 3C:
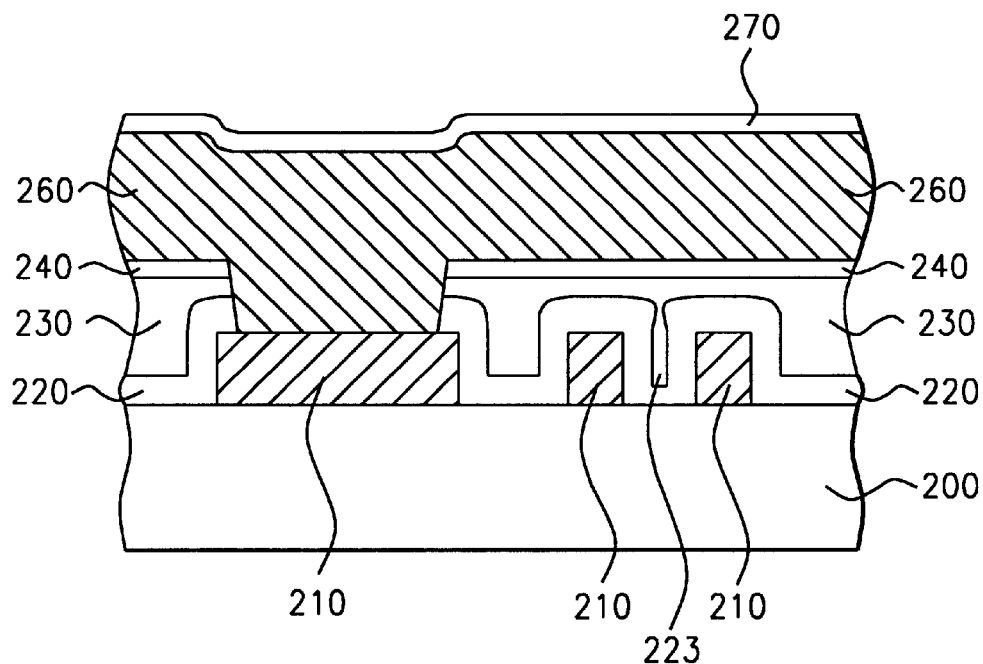
FIG. 3c is a cross-sectional view of a portion of a semiconductor substrate showing the forming of a bump metal layer covering the opening of FIG. 3b, according to this invention.

Next, metal layer (260), preferably aluminum, is deposited over the substrate, including opening (225) to a thickness between about 5.5 to 6.5 $\mu$m as shown in FIG. 3c. (Layer (260) may be referred to as "bump metal" as a "metal bump" such as an aluminum bump will be formed from it at a later step.) This is followed by the forming of composite layer (270) which is patterned to function as a hard-mask in forming aluminum bump at the next step. It is preferred that the composite layer comprises a layer of titanium nitride as an anti-reflective coating (ARC), and a layer of PEOX, each with a thickness between about 900 to 1100 Å. It is known in the art that titanium ARCs are used in order to minimize scattering from underlying films of aluminum during photolithographic exposure.

Figure 3D:
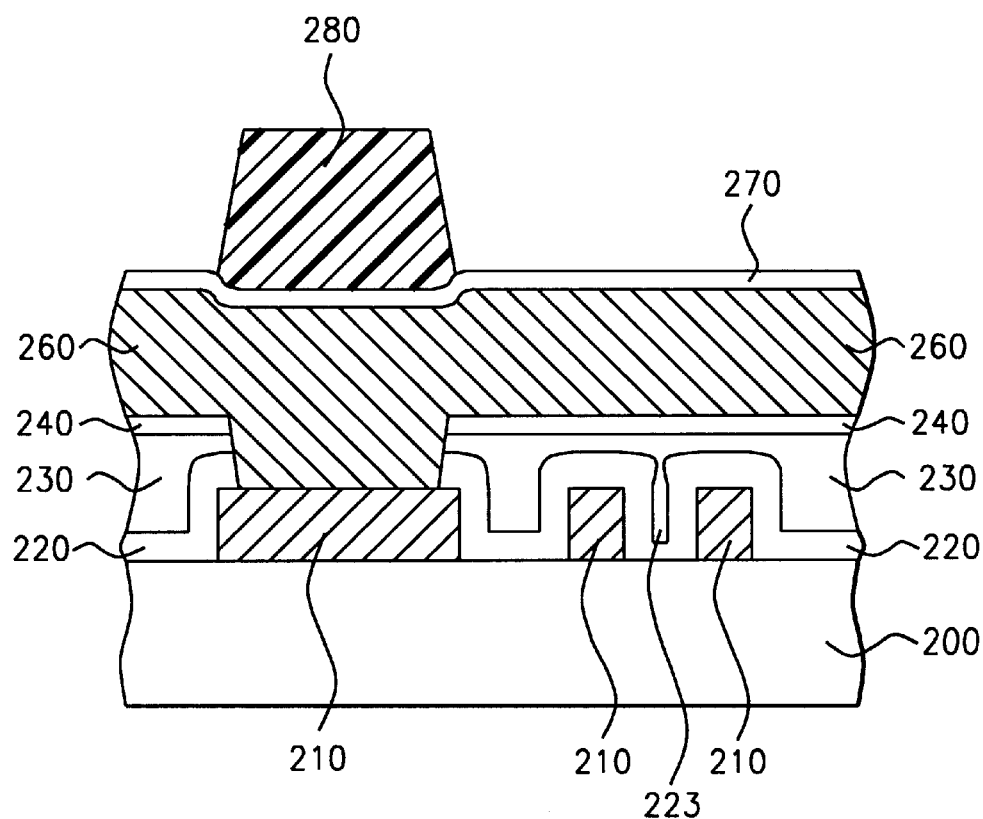
FIG. 3d is a cross-sectional view of a portion of a semiconductor substrate showing the patterning of the bump metal of FIG. 3c, according to this invention.
Figure 3E:
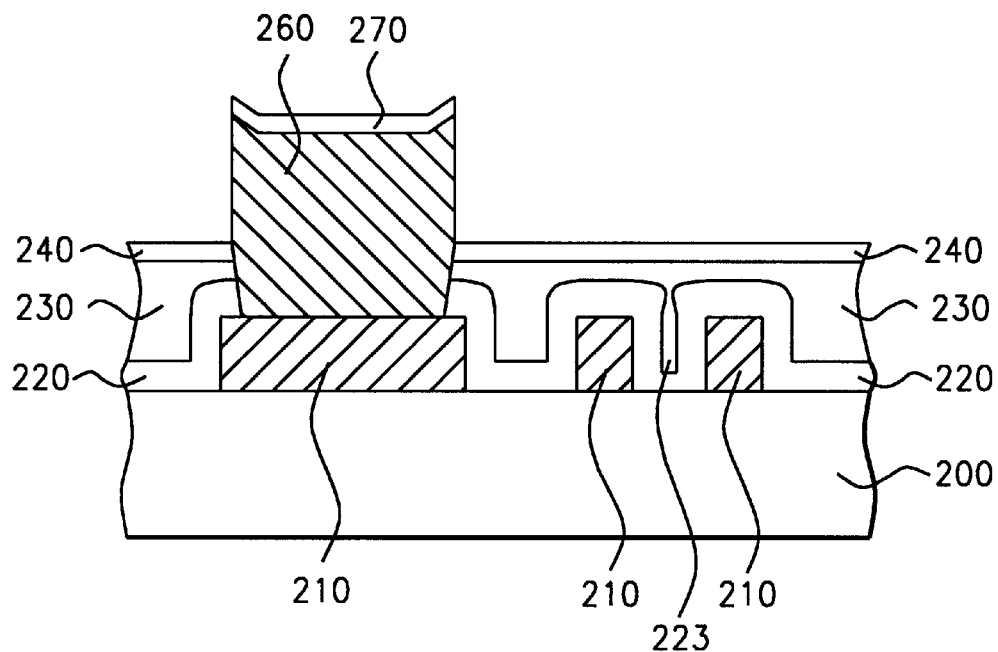
FIG. 3e is a cross-sectional view of a portion of a semiconductor substrate showing the forming of aluminum bump of this invention.
Figure 3F:
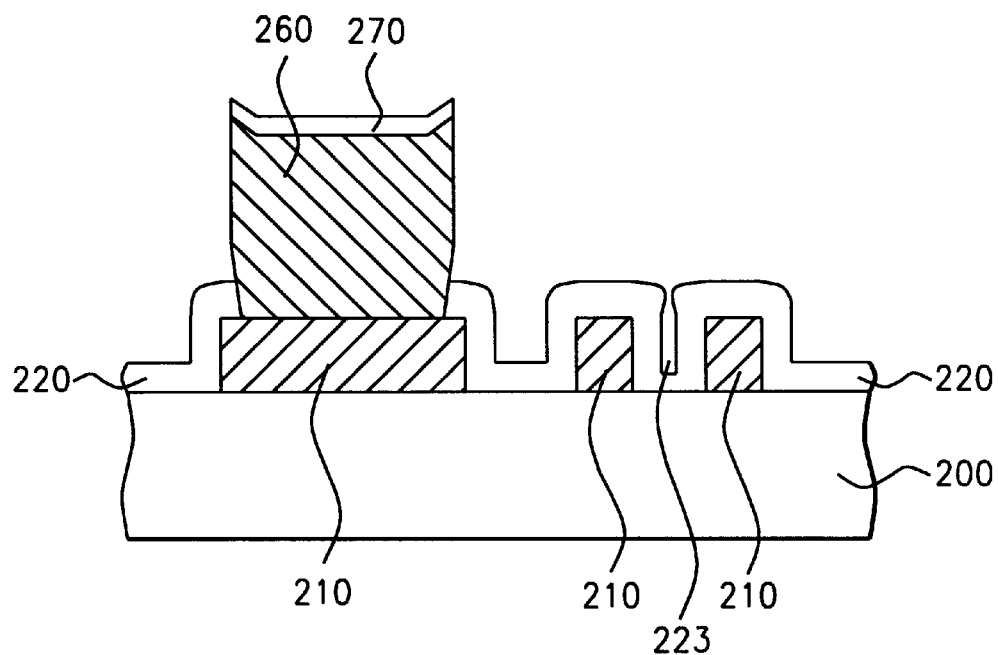
FIG. 3f is a cross-sectional view of a portion of a semiconductor substrate showing the removal of the sacrificial dielectric layer of this invention.

A second photoresist layer (280) shown in FIG. 3d is next formed and a lithographic process performed (not shown) to pattern composite layer (270), after which the photoresist layer is removed. The patterning of composite hard-mask layer (270) is accomplished by etching it with a recipe comprising He, $CF_4$ and $CHF_3$. Using the protected composite layer (270) as a hard-mask, metal layer (260) is finally etched to form aluminum bump (260) as shown in FIG. 3e. The etching of aluminum layer (260) is accomplished with a recipe comprising $BCl_3$, $Cl_2$, $N_2$ and $CF_4$.

It will be appreciated by workers in the field that the method taught in the present invention protects inclusions such as (223) from being invaded by metal (260) during the bump process through the introduction of SOG into the inclusions prior to the forming of the bump. Subsequent to the forming of the aluminum bump, however, both layers (240) and (230) are removed using a wet buffered oxide etch (BOE), preferably with a 10:1 recipe.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as with the different materials that can be used for the bump including aluminum, copper or gold.

While the invention has been particularly shown and described with reference to the preferred embodiments thereof, it will be understood by those skilled in the art that various changes in form and details may be made without departing from the spirit and scope of the invention.

What is claimed is:

1. An aluminum bump process comprising the steps of:
providing a silicon substrate having a composite passivation layer covering a top metal layer;
forming a composite dielectric layer over said passivation layer;
said composite dielectric layer further comprising a spin-on-glass (SOG) layer and a plasma enhanced oxide (PEOX) layer;
forming an opening through said composite dielectric layer and through said passivation layer to expose a portion of said top metal layer;
forming a bump metal over said substrate covering said portion of said top metal layer in said opening;
forming a hard-mask over said bump metal;
patterning said hard-mask over said bump metal;
etching through said hard-mask to form a metal bump in the underlying said bump metal; and
removing said composite dielectric layer over said passivation layer.

2. The method of claim 1, wherein said composite passivation layer comprises a layer of plasma enhanced oxide (PEOX) thickness between about 4000 to 5000 Å, and a layer of plasma enhanced silicon nitride (PESN) with a thickness between about 6000 to 6500 Å.

3. The method of claim 1, wherein said SOG layer of said composite dielectric is planarized to have a thickness between about 2500 to 3500 over said PEOX layer having a thickness between about 900 to 1100 Å.

4. The method of claim 1, wherein said forming said opening through said composite dielectric is accomplished using etch recipe comprising He, $CHF_3$ and $CF_4$.

5. The method of claim 1, wherein said bump metal is aluminum having a thickness between about 5.5 to 6.5 $\mu$m.

6. The method of claim 1, wherein said hard-mask comprises PEOX having a thickness between about 900 to 1100 Å.

7. The method of claim 1, wherein said etching through said patterning to form a metal bump is accomplished with a recipe comprising He, $CHF_3$ and $CF_4$.

8. The method of claim 1, wherein said removing said composite dielectric layer over said passivation layer is accomplished with buffered oxide etch (BOE) having a recipe of 10:1.

9. An aluminum bump process comprising the steps of:
providing a silicon substrate having a plurality of integrated circuits interconnected with multi-level metal layers through intervening insulating dielectric layers;
forming a top metal layer over said substrate;
said top metal layer having a portion with an interconnection pad;
forming a composite passivation layer over said top metal layer;
forming a spin-on-glass (SOG) layer over said composite passivation layer;
planarizing said SOG layer;
forming a nitride layer over said planarized SOG layer;
patterning said SOG and nitride layers;
etching through said patterned SOG and nitride layers to form an opening to expose said interconnection pad in said top metal layer;
forming a metal layer over said substrate covering said interconnection pad in said opening;
forming an anti-reflective coating (ARC) over said metal layer;
forming a hard-mask over said ARC;
patterning said hard-mask to define a bump;
etching through said patterning in said hard-mask to form a bump in said metal layer; and
removing said SOG layer.

10. The method of claim 9, wherein said top metal layer is aluminum or copper.

11. The method of claim 9, wherein said composite passivation layer comprises a layer of plasma enhanced oxide (PEOX) thickness between about 4000 to 5000 Å, and a layer of plasma enhanced silicon nitride (PESN) with a thickness between about 6000 to 6500 Å.

12. The method of claim 9, wherein said SOG layer has a thickness between about 2500 to 3500 Å.

13. The method of claim 9, wherein said planarizing is accomplished by using conventional techniques.

14. The method of claim 9, wherein said nitride layer is formed by reacting dichlorosilane ($SiCl_2H_2$), or silane ($SiH_4$), with ammonia ($NH_3$) at a temperature between about 650 to 750° C.

15. The method of claim 9, wherein said nitride layer has a thickness between about 6000 to 6500 Å.

16. The method of claim 9, wherein said patterning said SOG and nitride layers is accomplished with a recipe comprising He, $CHF_3$ and $CF_4$.

17. The method of claim 9, wherein said etching through said patterned SOG and nitride layers to form opening is accomplished with a recipe comprising He, $CHF_3$ and $CF_4$.

18. The method of claim 9, wherein said metal layer over said substrate is aluminum having a thickness between about 5.5 to 6.5 $\mu$m.

19. The method of claim 9, wherein said ARC is titanium nitride having a thickness between about 900 to 1100 Å.

20. The method of claim 9, wherein said hard-mask is PEOX having a thickness between about 900 to 1100 Å.

21. The method of claim 9, wherein said patterning said hard-mask is accomplished with a recipe comprising He, $CF_4$ and $CHF_3$.

22. The method of claim 9, wherein said etching through said patterning in said hard-mask to form a bump is accomplished with a recipe comprising $BCl_3$, $Cl_2$, $N_2$ and $CF_4$.

23. The method of claim 9, wherein said removing said SOG layer is accomplished with buffered oxide etch (BOE) having a recipe of 10:1.

* * * * *